United States Patent
Duqi et al.

(10) Patent No.: US 12,164,101 B2
(45) Date of Patent: Dec. 10, 2024

(54) MEMS OPTICAL DEVICE COMPRISING A LENS AND AN ACTUATOR FOR CONTROLLING THE CURVATURE OF THE LENS, AND RELATED MANUFACTURING PROCESS

(71) Applicant: poLight ASA, Skoppum (NO)

(72) Inventors: Enri Duqi, Milan (IT); Dario Paci, Vittuone (IT); Lorenzo Baldo, Bareggio (IT); Domenico Giusti, Caponago (IT)

(73) Assignee: poLight ASA, Skoppum (NO)

(*) Notice: Subject to any disclaimer, the term of this patent is extended or adjusted under 35 U.S.C. 154(b) by 0 days.

(21) Appl. No.: 18/358,873

(22) Filed: Jul. 25, 2023

(65) Prior Publication Data

US 2024/0061236 A1 Feb. 22, 2024

Related U.S. Application Data

(62) Division of application No. 16/847,514, filed on Apr. 13, 2020, now Pat. No. 11,747,608.

(30) Foreign Application Priority Data

Apr. 15, 2019 (IT) .......... 102019000005802

(51) Int. Cl.
*B81B 3/00* (2006.01)
*G02B 26/08* (2006.01)
*H01L 27/146* (2006.01)

(52) U.S. Cl.
CPC ............ *G02B 26/08* (2013.01); *B81B 3/0018* (2013.01); *H01L 27/14627* (2013.01); *B81B 2201/047* (2013.01)

(58) Field of Classification Search
CPC ............ B81B 3/0018; B81B 2201/047; B81B 3/0083; G02B 26/08; G02B 7/08; G02B 26/06; G02B 26/0875; G02B 3/14; G02B 13/0075; H01L 27/14627
See application file for complete search history.

(56) References Cited

U.S. PATENT DOCUMENTS

| 8,045,280 B2 | 10/2011 | Henriksen et al. | |
| 2002/0149864 A1* | 10/2002 | Kaneko | G02B 3/14 359/224.1 |
| 2010/0232043 A1 | 9/2010 | Hishinuma | |
| 2011/0149409 A1 | 6/2011 | Haugholt et al. | |
| 2016/0059562 A1* | 3/2016 | Yoshioka | B41J 2/161 438/21 |

* cited by examiner

*Primary Examiner* — Wasiul Haider
(74) *Attorney, Agent, or Firm* — Seed IP Law Group LLP

(57) ABSTRACT

A MEMS optical device including: a semiconductor body; a main cavity, which extends within the semiconductor body; a membrane suspended over the main cavity; a piezoelectric actuator, which is mechanically coupled to the membrane and can be electronically controlled so as to deform the membrane; a micro-lens, mechanically coupled to the membrane so as to undergo deformation following the deformation of the membrane; and a rigid optical element, which contacts the micro-lens and is arranged so that the micro-lens is interposed between the rigid optical element and the membrane. The micro-lens and the main cavity are arranged on opposite sides of the membrane.

19 Claims, 17 Drawing Sheets

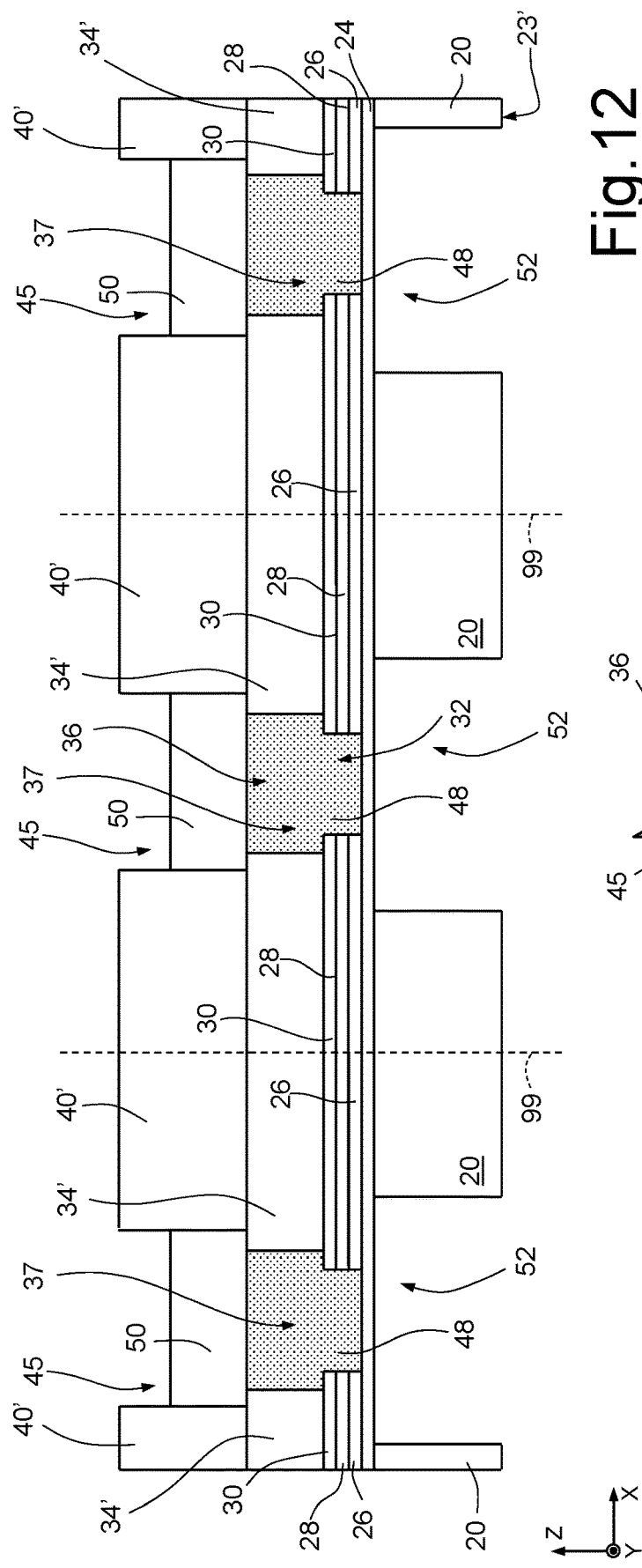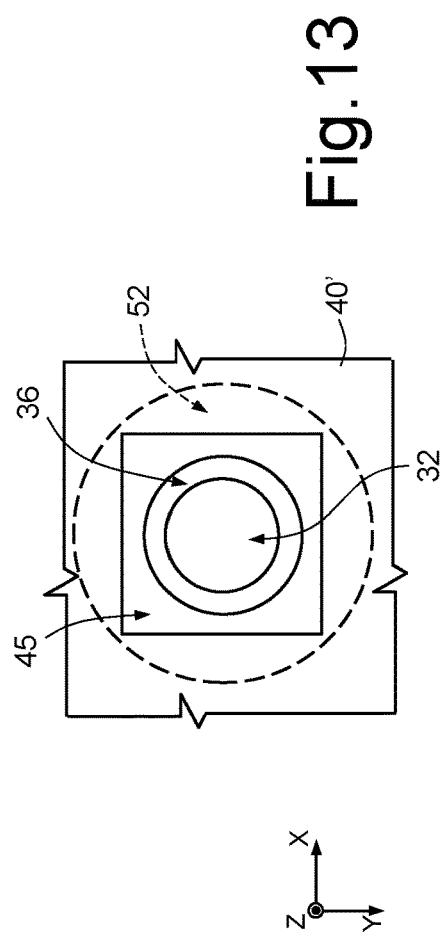

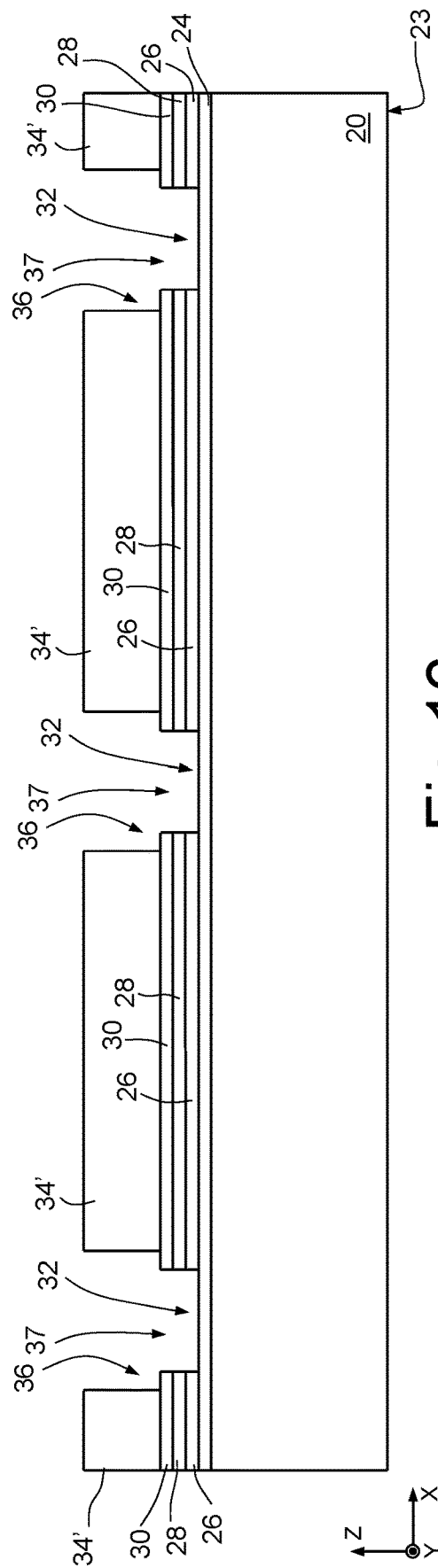
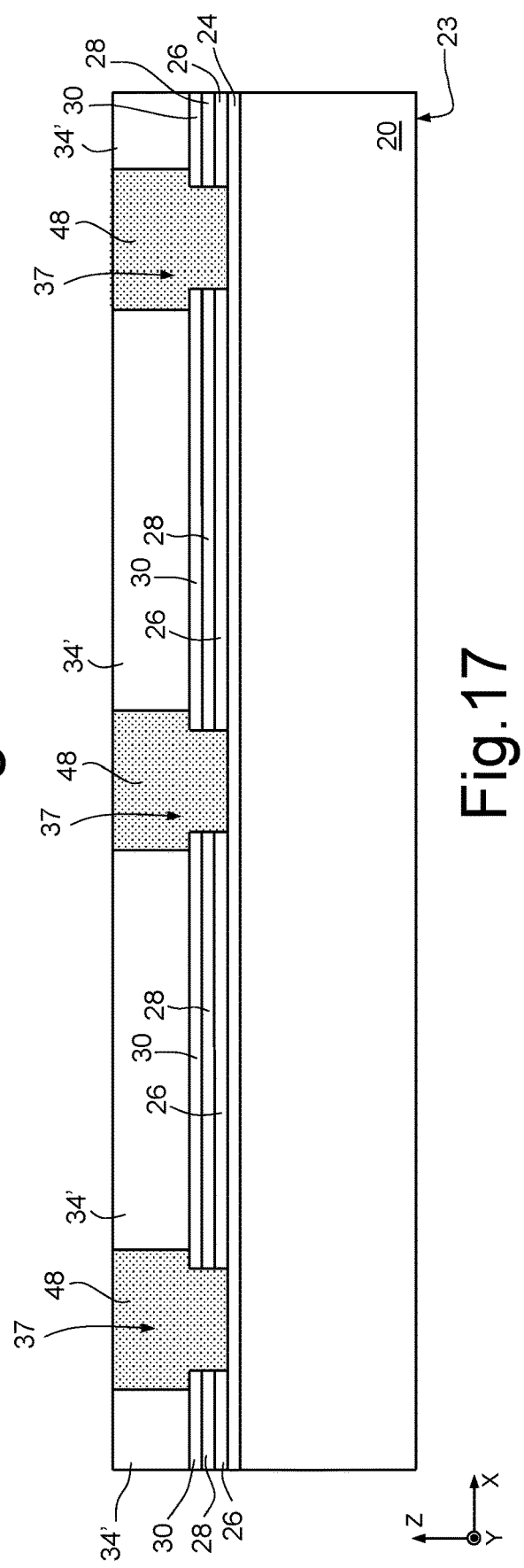

MEMS OPTICAL DEVICE COMPRISING A LENS AND AN ACTUATOR FOR CONTROLLING THE CURVATURE OF THE LENS, AND RELATED MANUFACTURING PROCESS

BACKGROUND

Technical Field

The present disclosure relates to a MEMS (Micro-Electro-Mechanical Systems) optical device, which comprises a lens and an actuator for controlling the curvature of the lens; moreover, the present disclosure relates to a corresponding manufacturing process.

Description of the Related Art

As is known, MEMS optical devices are today available, such as, for example, MEMS optical devices with micro-lenses having a reconfigurable focus.

For instance, FIG. 1 illustrates a MEMS device 1, which comprises a semiconductor body 2, which laterally delimits a cavity 3 and is delimited by a front surface $S_f$. Furthermore, the MEMS device 1 comprises a membrane 4, which extends over the front surface $S_f$ so as to close the cavity 3 at the top and is made of silicon oxide.

The MEMS device 1 further comprises a piezoelectric actuator 6, which has an annular shape in top plan view (not illustrated) and extends on the membrane 4. The piezoelectric actuator 6 comprises a piezoelectric layer, made, for example, of lead zirconate titanate (PZT). In addition, the piezoelectric actuator 6 laterally delimits a recess 7, which is delimited at the bottom by an internal portion of the membrane 4, a peripheral portion of which is hence overlaid by the piezoelectric actuator 6. This peripheral portion of the membrane 4 is fixed to the semiconductor body 2.

The MEMS device 1 also comprises a micro-lens 8 made of soft (and hence deformable) and transparent polymeric material. The micro-lens 8 extends underneath the central portion of the membrane 4 and typically has a circular shape in top plan view. Moreover, the MEMS device 1 comprises a supporting element, which is typically formed by a supporting region 10 made of vitreous material (for example, silicon oxide), which extends underneath the micro-lens 8. The supporting region 10 is planar and, for reasons of cost, typically has a square shape in top plan view. For this reason, typically the cavity 3, inside which the micro-lens 8 and the supporting region 10 extend, also has a square shape in top plan view.

In practice, the micro-lens 8 defines an optical axis O. Moreover, the piezoelectric actuator 6 can be governed so as to deform the membrane 4, as well as the micro-lens 8, in order to vary the position of focus of the micro-lens 8 itself.

In this way, by assuming an optical beam that propagates with axis parallel to the optical axis O, impinges upon the supporting region 10, and passes through the supporting region 10, the micro-lens 8, and the membrane 4, it is possible to vary the position of the point on which the optical beam is focused, downstream of the membrane 4. In particular, the focusing process is controlled by the curvature that the deformation of the membrane 4, caused by the piezoelectric actuator 6, induces on a top surface 8' of the micro-lens 8, this top surface 8' being in contact with the membrane 4. Instead, the bottom surface 8" of the micro-lens 8 does not undergo deformation together with the top surface 8', but remains planar, on account of the presence of the supporting region 10 to which it is fixed; in practice, the supporting region 10 bestows rigidity on the portion of micro-lens 8 that forms the bottom surface 8". Ideally, in the absence of signal on the piezoelectric actuator 6, also the top surface 8' of the micro-lens 8 is planar.

The MEMS device 1 can hence be used, for example, to implement autofocus functions through known methods of feedback on the (voltage) control signal to the piezoelectric actuator 6.

Unfortunately, the process for manufacturing the MEMS device 1, starting from a wafer of semiconductor material, is relatively complex and costly. In particular, formation of the micro-lens 8 envisages deposition of the polymeric material on the back of the wafer, within the cavity 3; this backend operation is, in fact, relatively complex and costly. Moreover, the fact that the supporting element 10 is housed in the cavity 3 means that the shape of the supporting element 10 constrains the shape of the cavity 3 in order to reduce the overall dimensions. Since, as has been said, the supporting element 10 typically has a square shape, also the cavity 3 is therefore square-shaped, with consequent increase in the undesirable optical effects (for example, aberration) on the micro-lens 8, due to the lack of circular symmetry of the cavity 3 formed by the semiconductor body 2, and hence also of the part of membrane 4 suspended over the cavity 3, to which the micro-lens 8 is fixed.

BRIEF SUMMARY

One or more embodiments of the present disclosure provide a solution that will overcome at least in part the drawbacks of the prior art.

According to the present disclosure, a MEMS optical device and a manufacturing process are hence provided.

BRIEF DESCRIPTION OF THE SEVERAL VIEWS OF THE DRAWINGS

For a better understanding of the present disclosure, preferred embodiments thereof are now described, purely by way of non-limiting examples, with reference to the attached drawings, wherein:

FIGS. 2-12 and 14 are schematic cross-sectional views of a semiconductor wafer, during successive steps of a process for manufacturing the present MEMS optical device;

FIG. 13 is a schematic top plan view of a portion of the wafer, with portions removed, during a step of the process for manufacturing the present MEMS optical device;

FIGS. 16-20 are schematic cross-sectional views of a semiconductor wafer, during successive steps of a variant of the manufacturing process of the present MEMS optical device;

DETAILED DESCRIPTION

Figure 1:
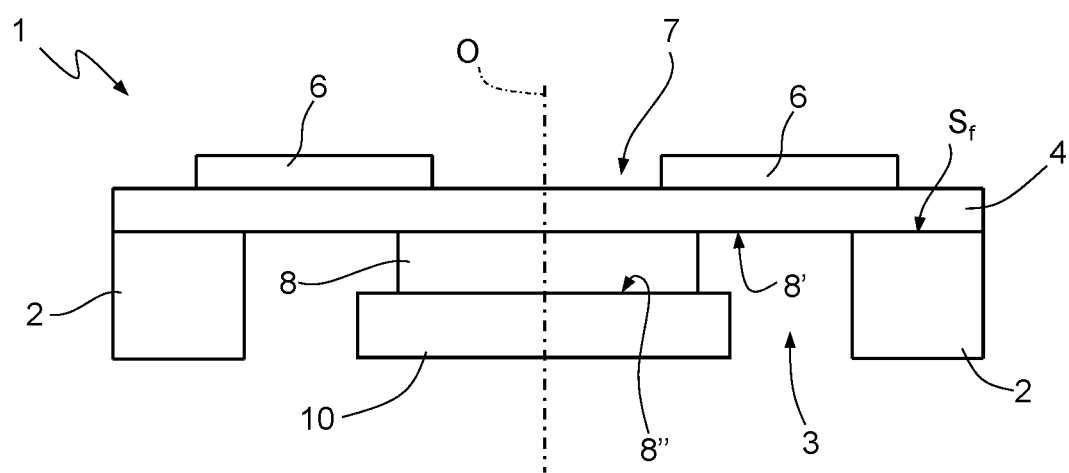
FIG. 1 is a schematic cross-sectional view of a MEMS device of a known type.
Figure 2:

As illustrated in FIG. 2, a semiconductor wafer 20 is initially provided, made, for example, of silicon, which is delimited by a top face 22 and a bottom face 23 and has a thickness, for example, of 700 µm. Arranged, in succession, on the top face 22 are a dielectric layer 24, a first conductive layer 26, a piezoelectric layer 28, and a second conductive layer 30. In practice, the first and the second conductive layers 26, 30 and the piezoelectric layer 28 form a multilayer structure.

The dielectric layer 24 is formed, for example, by a glass (e.g., silicon oxide) and contacts the top face 22. For instance, the dielectric layer 24 may be formed by deposition and is optically transparent (i.e., non-absorbent) in the visible, to a first approximation.

The first and the second conductive layers 26, 30 are made, for example, of an alloy of titanium and platinum. The piezoelectric layer 28 is made, for example, of PZT and, as has been said previously, is interposed, in direct contact, between the first and the second conductive layers 26, 30. In a way in itself known, the first and the second conductive layers 26, 30 and the piezoelectric layer 28 may be formed by corresponding deposition processes.

Figure 3:
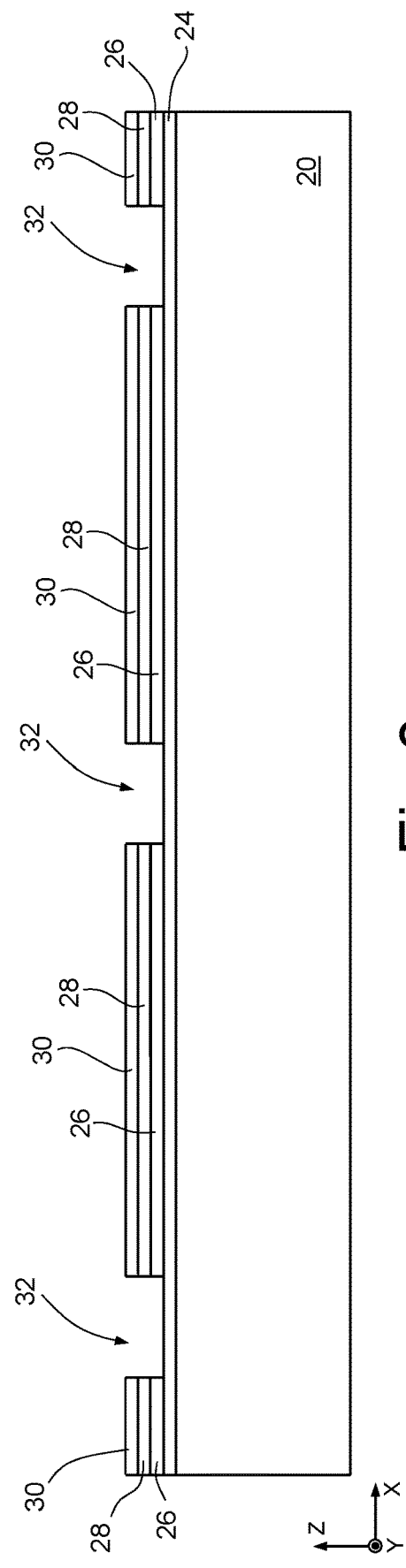

Next, as illustrated in FIG. 3, the first and second conductive layers 26, 30 and the piezoelectric layer 28 are patterned. In particular, an etch (for example, of a dry type) is carried out so as to selectively remove portions of the second conductive layer 30 and underlying portions of the piezoelectric layer 28 and of the first conductive layer 26 in order to expose corresponding portions of the dielectric layer 24. In practice, first cavities 32 are formed, which extend through the structure formed by the first and the second conductive layers 26, 30 and by the piezoelectric layer 28 and are delimited at the bottom by the exposed portions of the dielectric layer 24. In top plan view, the first cavities 32 have, purely by way of example, a cylindrical shape.

Figure 4:
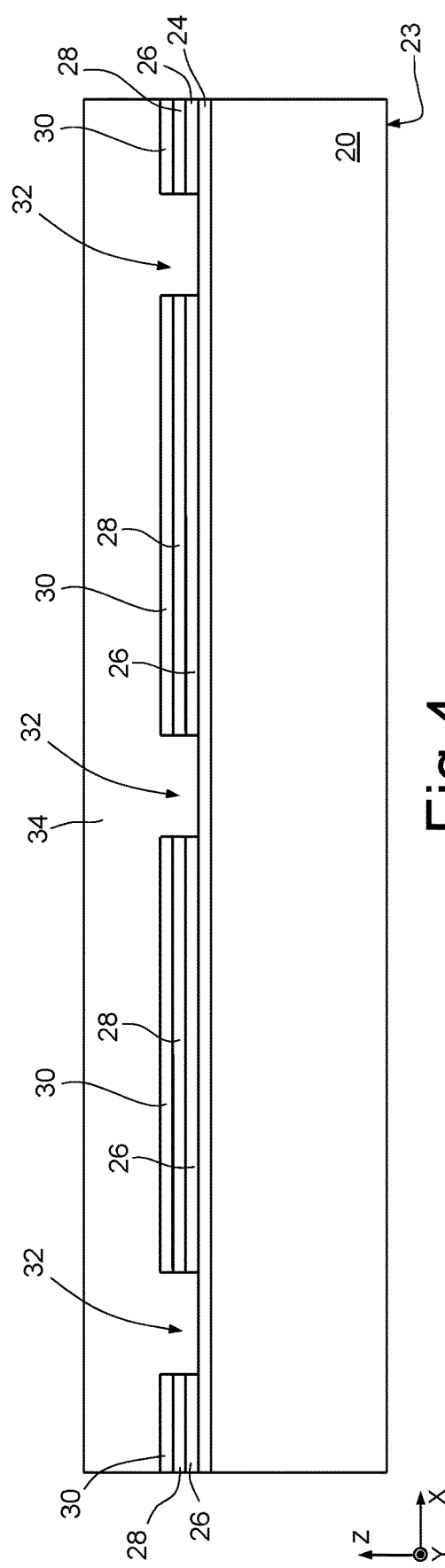

Next, as illustrated in FIG. 4, a first top region 34 is formed, which is formed by an optically sensitive polymeric resist and extends on the second conductive layer 30, as well as within the first cavity 32. For instance, the first top region 34 is formed by means of a spinning process.

Figure 5:
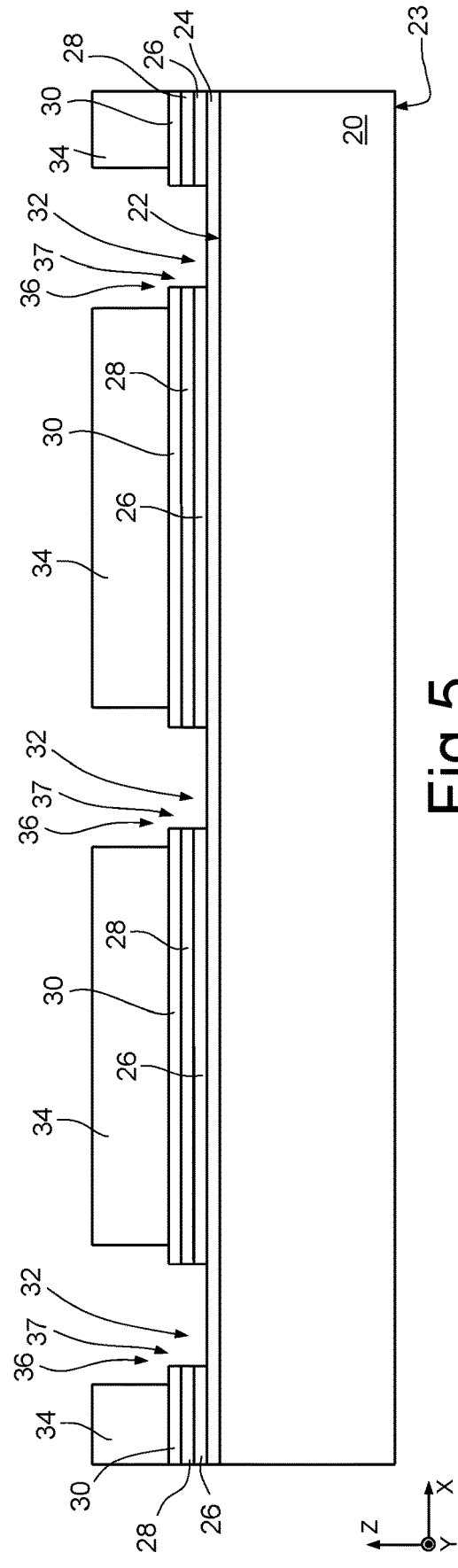

Then, as illustrated in FIG. 5, a photolithographic process is carried out, which includes a development step, which enables selectively removing portions of the first top region 34 and forming corresponding second cavities 36, each of which traverses the first top region 34 and entirely overlies a corresponding first cavity 32, with which it communicates, to form a corresponding first chamber 37. In top plan view, the second cavities 36 have, for example, a cylindrical shape. Moreover, assuming an orthogonal reference system XYZ such that the plane XY is parallel to the top face 22 of the wafer 20, each second cavity 36 is to a first approximation vertically aligned with the underlying first cavity 32 and has a diameter larger than that of the underlying first cavity 32.

In practice, the operations referred to in FIG. 5 also comprise removal of the portions of the first top region 34 that occupy the first cavities 32, which are hence freed, without affecting the first and the second conductive layers 26, 30, or the piezoelectric layer 28.

Figure 6:
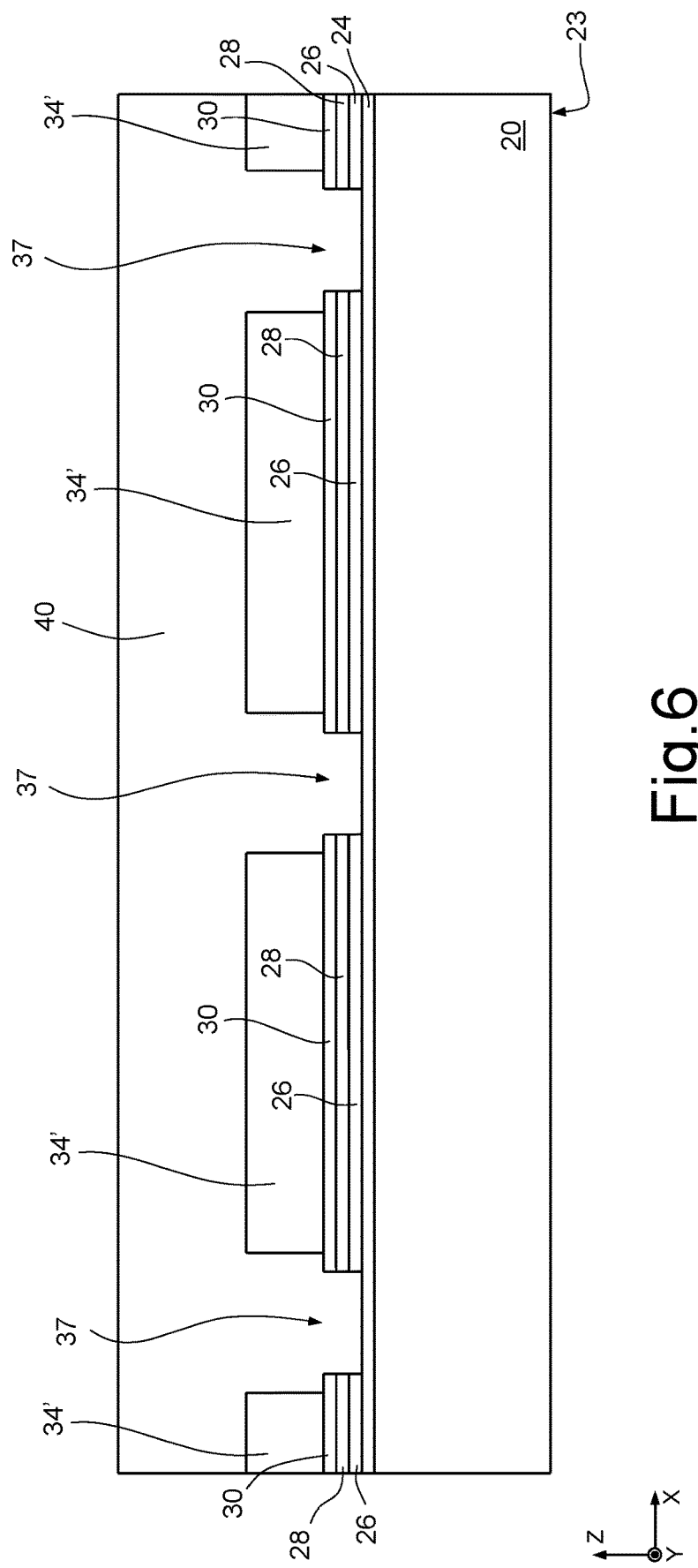

Next, as illustrated in FIG. 6, the first top region 34 is subjected to a curing process (for example, of a thermal type) so as to form a first cured region 34'. Moreover, a second top region 40 is created, which is formed by a polymeric resist, which is, for example, the same polymeric resist used for the first top region 34 and extends over the first cured region 34', as well as within the first chambers 37. For instance, the second top region 40 is formed by means of a spinning process.

Figure 7:
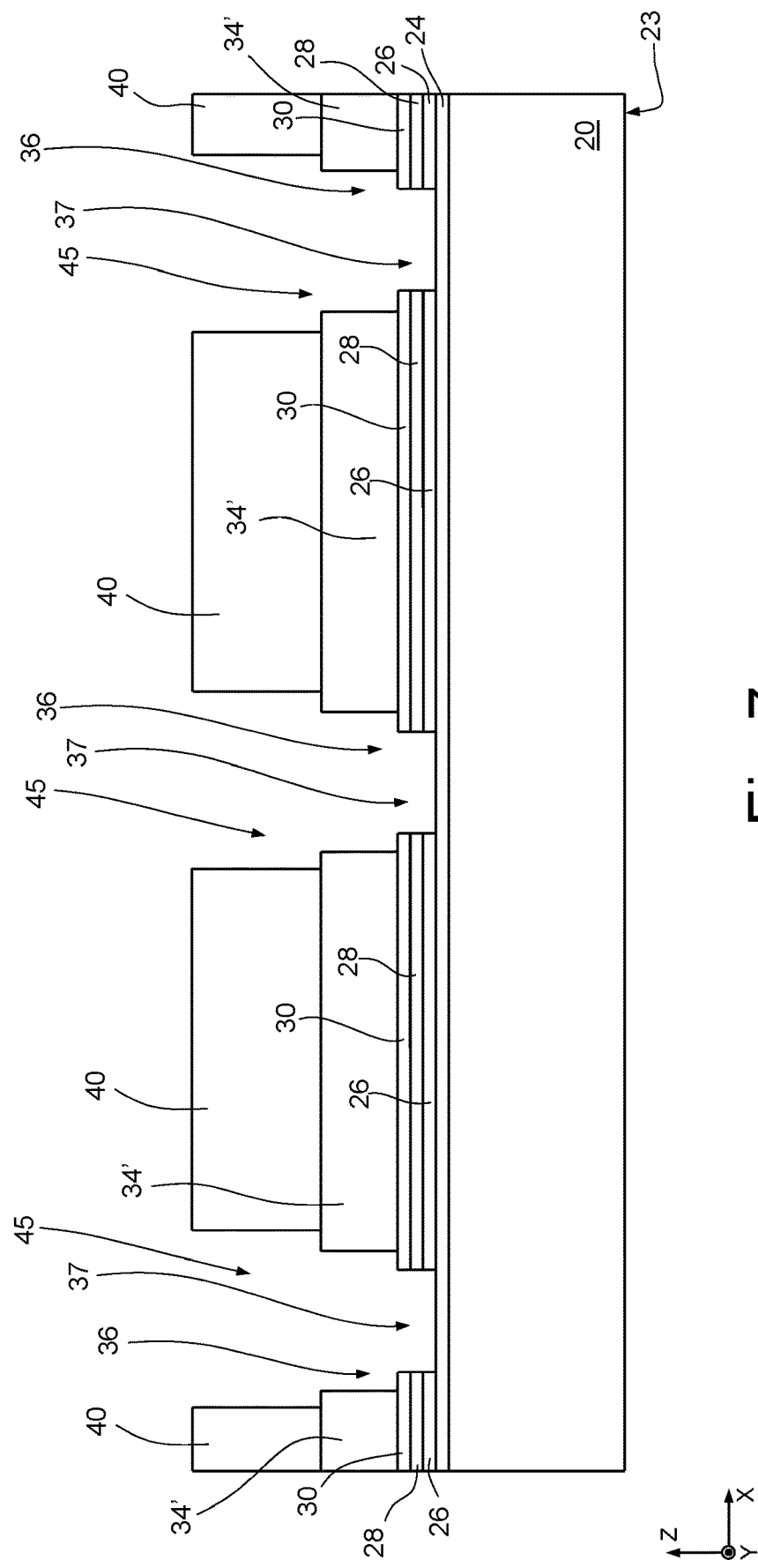

Next, as illustrated in FIG. 7, a new photolithographic process is carried out, which includes a development step that enables selective removal of portions of the second top region 40 and formation of corresponding third cavities 45, as well as release once again of the first chambers 37. In fact, to a first approximation, the first cured region 34' is not involved again in this new photolithographic process. Likewise, also the first and the second conductive layers 26, 30 and the piezoelectric layer 28 are not affected.

In greater detail, each third cavity 45 extends on top of a corresponding first chamber 37, with which it communicates. Moreover, to a first approximation, each third cavity 45 has the shape of a parallelepiped vertically aligned with the underlying first chamber 37, and in particular with the underlying second cavity 36. In addition, in top plan view, the second cavity 36 is entirely arranged within the third cavity 45 (as may be seen, for example, in FIG. 13), which hence has a base with an area greater than the base of the second cavity 36. Each third cavity 45 forms a sort of second chamber.

Figure 8:
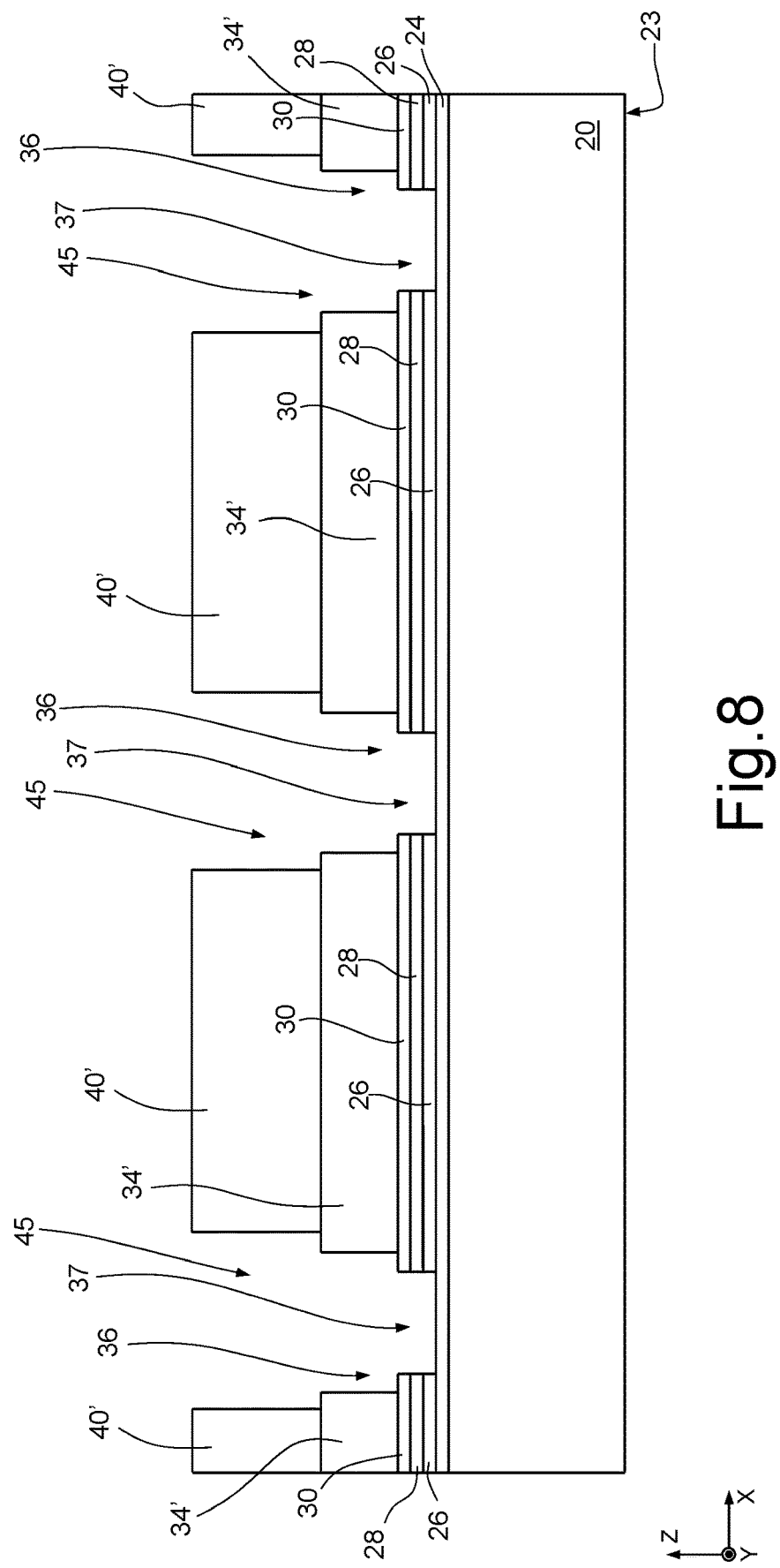

Then, as illustrated in FIG. 8, the second top region 40 is subjected to a curing process (for example, of a thermal type), so as to form a second cured region 40'.

Figure 9:
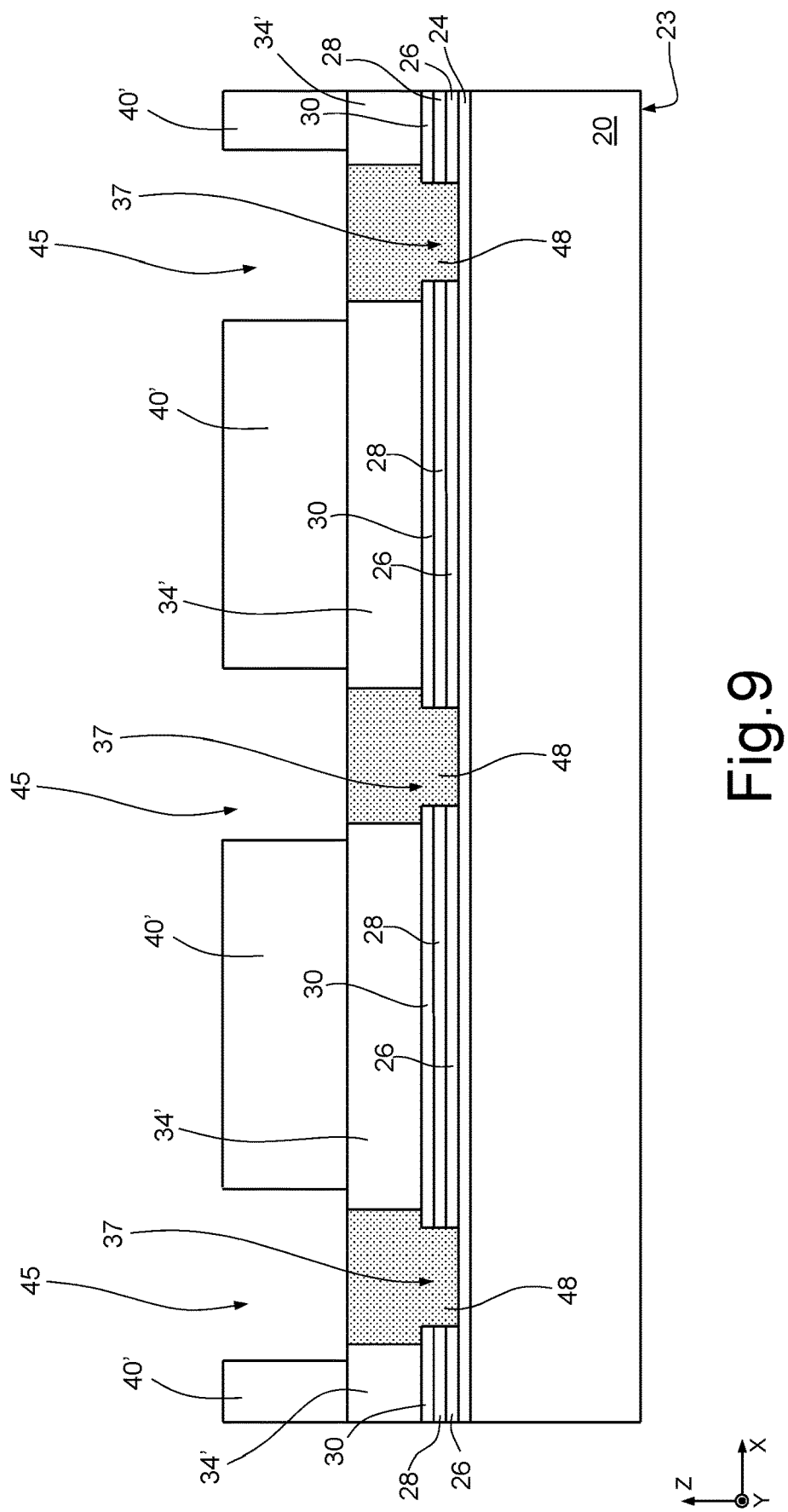

Next, as illustrated in FIG. 9, a deposition of a polymeric gel is carried out, so as to fill the first chambers 37, followed by curing thereof. In practice, within each first chamber 37 a corresponding micro-lens 48 is formed, which extends underneath a corresponding third cavity 45, delimiting the latter at the bottom. To a first approximation, each micro-lens 48 is hence formed by a bottom portion and a top portion, which have cylindrical shapes and fill, respectively, the corresponding first and second cavities 32, 36; the top portion of the micro-lens 48 hence overlies a part of the ensemble formed by the first and the second conductive layers 26, 30 and the piezoelectric layer 28, this part of the ensemble laterally surrounding the bottom portion of the micro-lens 48.

To a first approximation, the micro-lenses 48 are optically non-absorbent in the visible.

Figure 10:
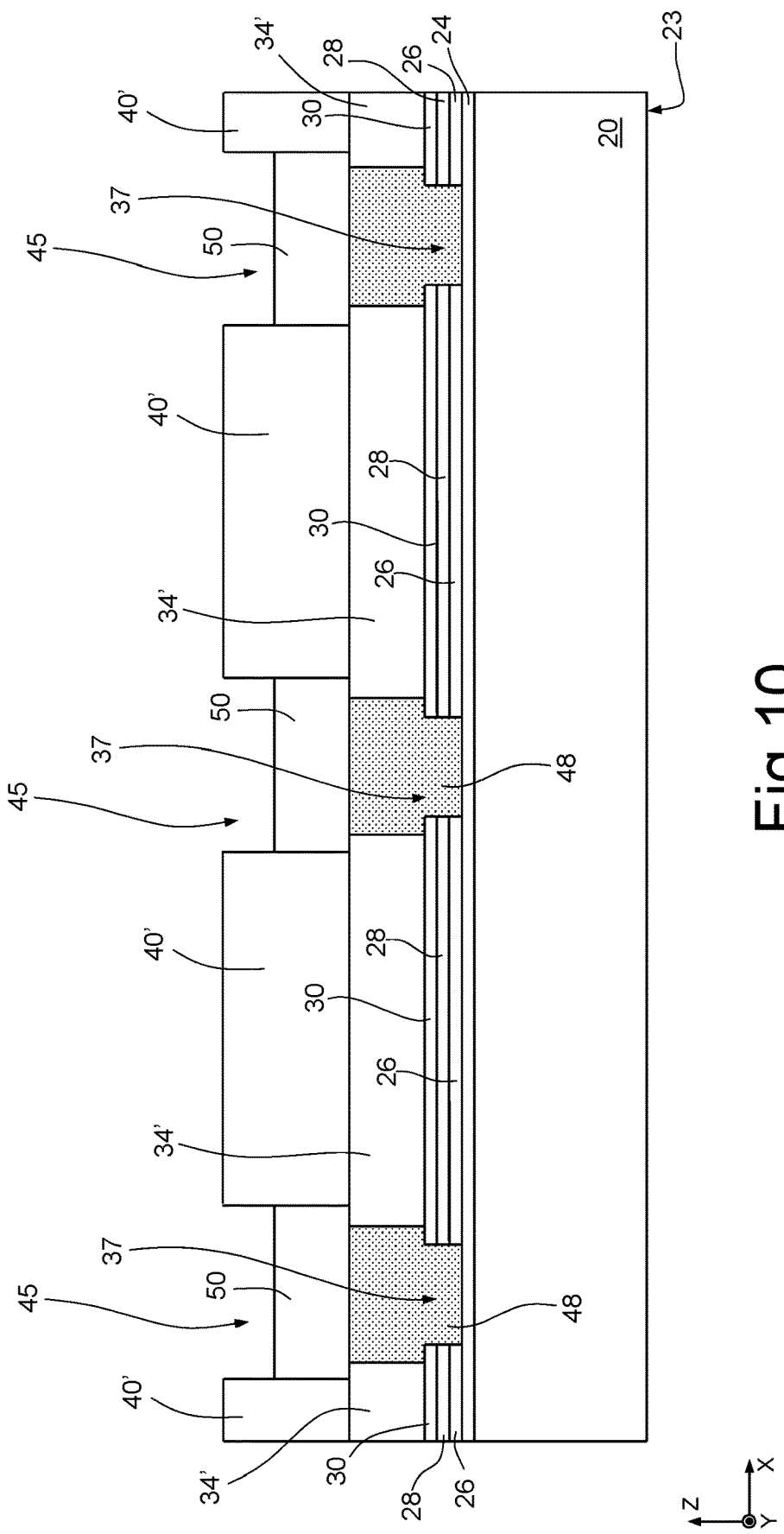

Then, as illustrated in FIG. 10, by means of a pick-and-place apparatus of a known type, arranged within each third cavity 45 is a corresponding supporting element 50, which is formed by vitreous material (for example, silicon oxide) and has a parallelepipedal shape, with a base substantially equal to the base of the corresponding third cavity 45, and a smaller height. In greater detail, each supporting element 50 is arranged on the bottom of the corresponding third cavity 45, in contact with the underlying micro-lens 48. Moreover, to a first approximation, the supporting elements 50 are non-absorbent in the visible.

Figure 11:
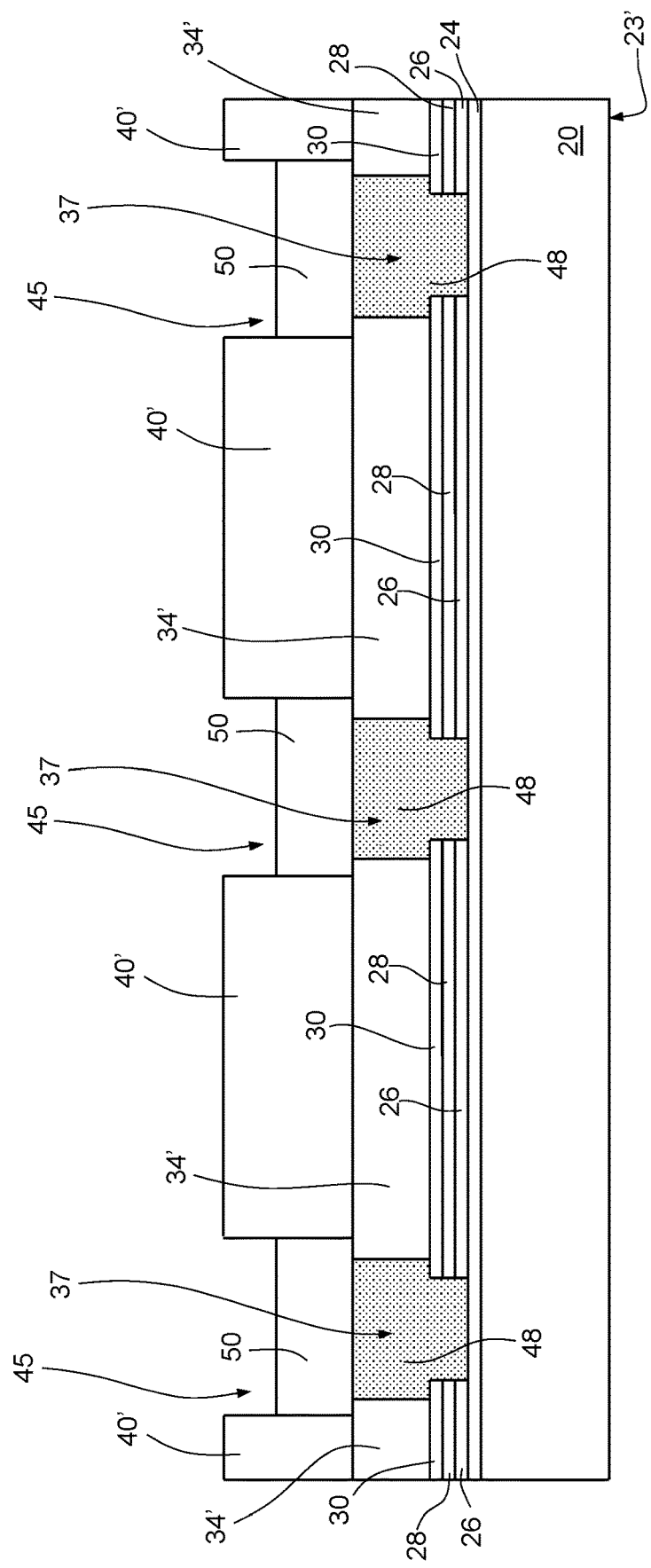

Next, as illustrated in FIG. 11, lapping of the wafer 20 is carried out, starting from the bottom face 23, in order to reduce the thickness. At the end of the lapping operation, the wafer 20 has a thickness, for example, of 200 µm and is delimited at the bottom by a lapped surface 23'.

There then follows, as illustrated in FIG. 12, a dry etch, so as to obtain selective removal of portions of the wafer 20, starting from the lapped surface 23', to form corresponding fourth cavities 52.

In particular, each fourth cavity 52 extends through the wafer 20, starting from the lapped surface 23', as far as the dielectric layer 24. For instance, the etching operation that leads to formation of the fourth cavities 52 is of the type with etch stop on the dielectric. Thanks to the previous lapping, it is possible to precisely control the process of removal of the semiconductor material, as far as the dielectric layer 24; moreover, the amount of semiconductor material that is removed is reduced.

In greater detail, each fourth cavity 52 is, to a first approximation, vertically aligned to a corresponding first chamber 37 and to the overlying third cavity 45. Moreover, each fourth cavity 52 has a cylindrical shape, with a diameter, for example, larger than the diameter of the overlying second cavity 36, and hence also than the diameter of the overlying first cavity 32. Moreover, the diameter of the fourth cavity 52 may be such that, in top plan view, the third cavity 45 is entirely arranged within the fourth cavity 52, as illustrated in FIG. 13, where for simplicity only the lateral profiles of a third cavity 45 and of the corresponding first, second, and fourth cavities 32, 36, and 52 are illustrated, on the hypothesis that the corresponding supporting element 50 and the corresponding micro-lens 48 are absent.

In practice, assuming that the wafer 20 has the orientation illustrated in FIG. 12, each fourth cavity 52 is delimited at the top by a corresponding exposed portion of the dielectric layer 24, this exposed portion being in turn in direct contact with the corresponding micro-lens 48. The fourth cavity 52 and the micro-lens 48 are arranged on opposite sides of the dielectric layer 24.

Figure 14:
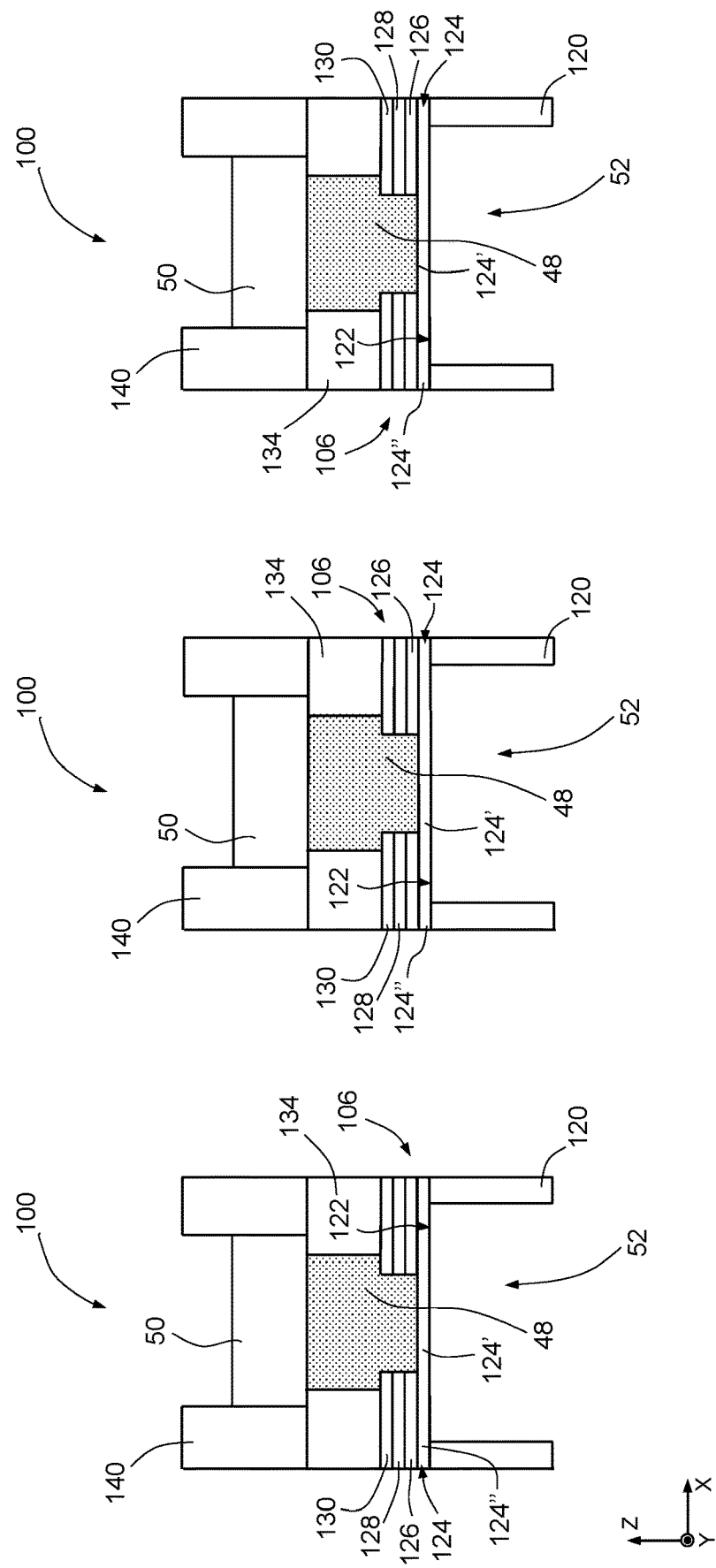

Then, as illustrated in FIG. 14, an operation of dicing is carried out, along scribe lines 99 (illustrated in FIG. 12) that extend through the portions of the first and the second cured regions 34', 40', of the wafer 20, of the first and second conductive layers 26, 30, of the piezoelectric layer 28, as well as through the dielectric layer 24.

The dicing operations lead to formation of a plurality of MEMS optical devices 100, all the same as one another.

In particular, with reference to a MEMS optical device 100, the corresponding residual portion of wafer 20 forms a semiconductor body 120, extending through which is a corresponding fourth cavity 52. The semiconductor body 120 is delimited at the top by a respective front surface 122.

The residual portion of the dielectric layer 24 forms a suspended region 124, which extends on the front surface 122 so as to close the fourth cavity 52 at the top. A peripheral portion 124" of the suspended region 124 is fixed to the semiconductor body 120, whereas a central portion of the suspended region 124 forms a membrane 124'. The micro-lens 48 rests on a central part of the membrane 124'.

Moreover, the residual portions (designated, respectively, by 126, 130, and 128) of the first and the second conductive layers 26, 30 and of the piezoelectric layer 28 form an actuator 106. In particular, the residual portions 126, 130 of the first and the second conductive layers 26, 30 form a bottom electrode and a top electrode, respectively, which enable biasing of the actuator 106.

The actuator 106 is hence formed by a respective multilayer structure and is arranged on a peripheral part of the membrane 124', which surrounds the central part of the membrane 124', as well as on the peripheral portion 124" of the suspended region 124, which overlies the part of the semiconductor body 120 that surrounds the fourth cavity 52.

The residual portions of the first and the second cured regions 34', 40' are designated by 134 and 140, respectively.

Figure 15:
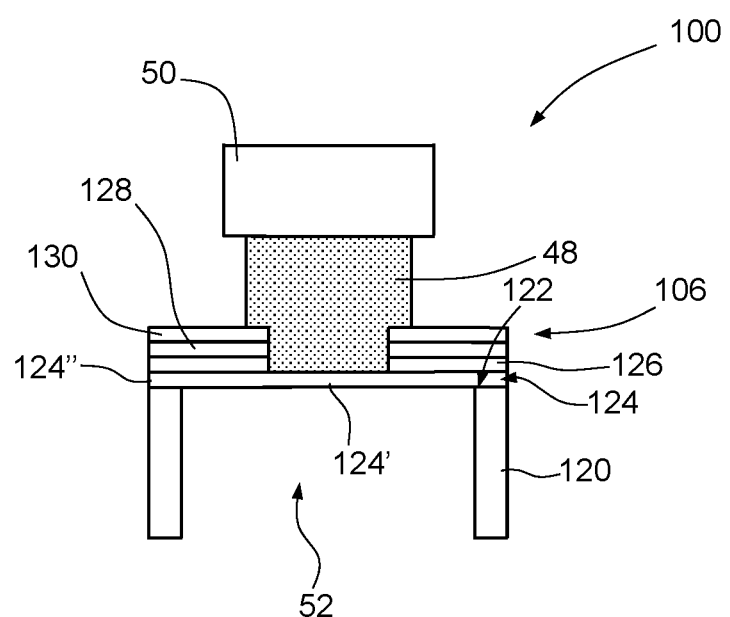
FIGS. 15 and 21 are schematic cross-sectional views of embodiments of the present MEMS optical device.

As illustrated in FIG. 15 with reference, for simplicity of representation, to just one MEMS optical device 100, the residual portions 134, 140 of the first and the second cured regions 34', 40' are then selectively removed by means of plasma etching.

According to a variant of the present manufacturing process, the same operations as those described with reference to FIGS. 2-5 are carried out.

Then, as illustrated in FIG. 16, the first top region 34 is cured so as to form the first cured region 34'.

Next, as illustrated in FIG. 17, the micro-lenses 48 are formed within the first chamber 37.

Figure 18:
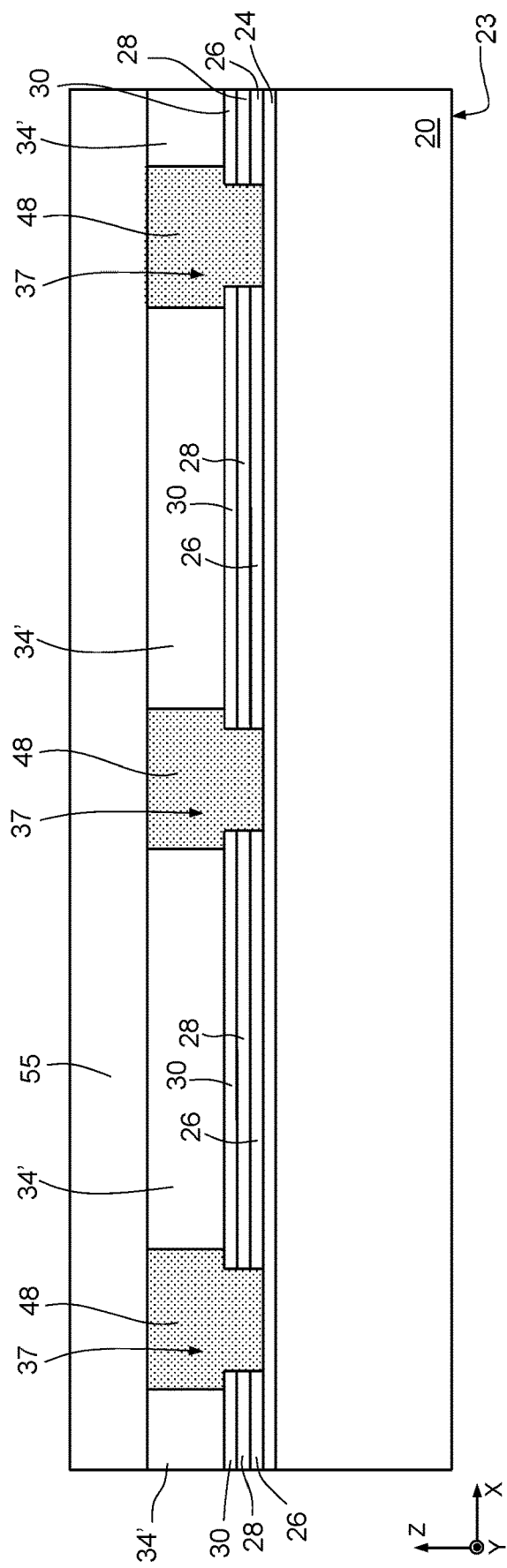

Then, as illustrated in FIG. 18, arranged on the first cured region 34' and the micro-lenses 48, in direct contact therewith, is a plate 55, which is formed by vitreous material (for example, silicon oxide) and does not absorb radiation in the visible.

Figure 19:
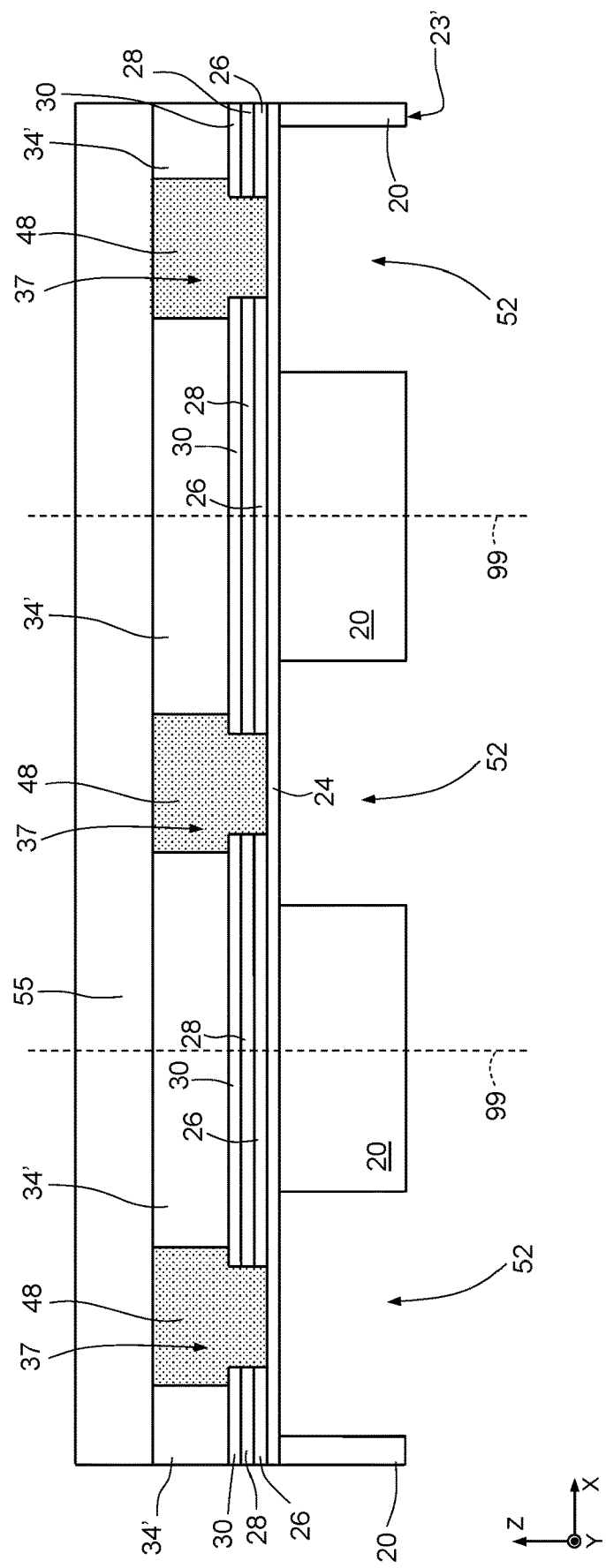

Then, as illustrated in FIG. 19, the operations of lapping of the wafer 20 and of etching, described with reference to FIGS. 11 and 12, are carried out so as to form the fourth cavities 52.

Figure 20:
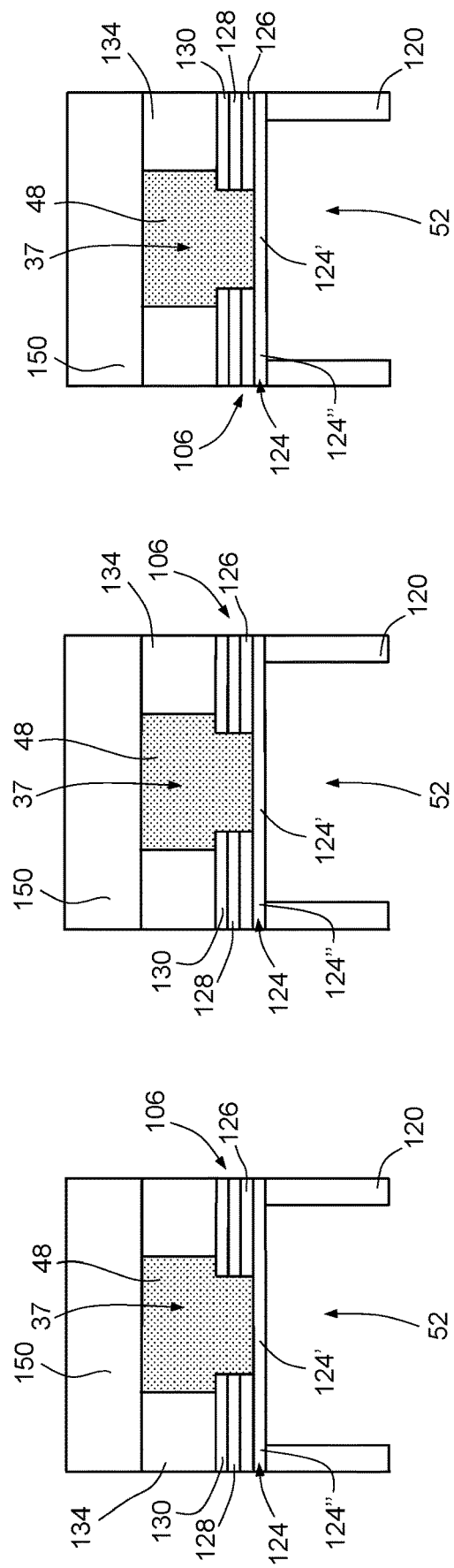

Next, as illustrated in FIG. 20, a dicing operation is carried out along the scribe lines 99 (illustrated in FIG. 19) so as to obtain the MEMS optical devices 100. In FIG. 20, elements already illustrated in FIG. 14 are designated by the same reference numbers. With respect to what is illustrated in FIG. 14, each MEMS device 100 is without the residual portion 140 of the second cured region 40'. Moreover, following upon dicing, the separate portions of the plate 55 form corresponding supporting elements, here designated by 150. Each supporting element 150 overlies entirely, not only the micro-lens 48, but also the residual portion 134 of the first cured region 34'.

Figure 21:
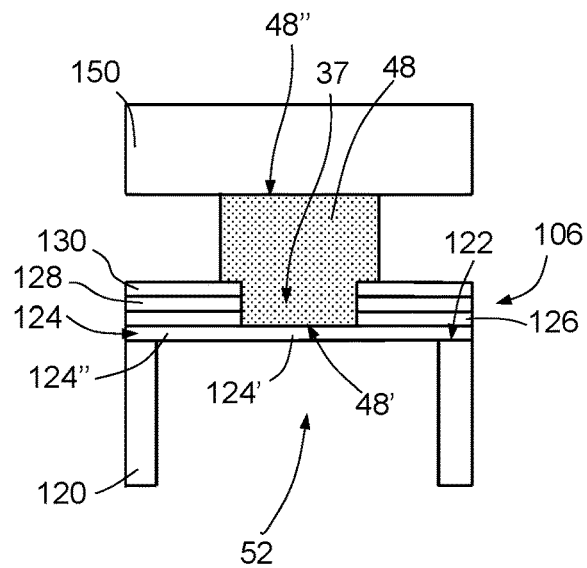

Next, as illustrated in FIG. 21, with reference, for simplicity, to a single MEMS optical device 100, a plasma etch is carried out in order to selectively remove the residual portion 134 of the first cured region 34'.

In practice, as also in the case of the embodiment illustrated in FIG. 15, the fourth cavity 52 functions as main cavity of the MEMS optical device, over which the membrane 124' is suspended. The first, second, and third cavities 32, 36, and 45 form, instead, corresponding first, second, and third openings, respectively through the multilayer structure of the actuator 106, the first top region 34 (and the first cured region 34'), and the second top region 40 (and the second cured region 40').

Figure 22:
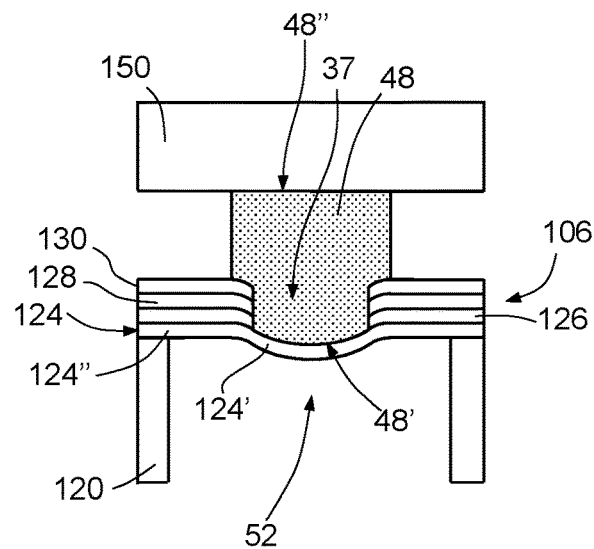
FIG. 22 is a schematic cross-sectional view of the embodiment illustrated in FIG. 21, in a different operating condition.

Deformation of the membrane 124', induced in an electronically controllable way by the actuator 106, enables variation of the curvature of the micro-lens 48 (as illustrated, for example, in FIG. 22), and in particular of a first surface (designated by 48' in FIGS. 21-22) of the micro-lens 48 that faces the membrane 124'. A second surface (designated by 48" in FIGS. 21-22) of the micro-lens 48 remains, instead, plane, since it contacts the supporting element 150, which performs the action of guaranteeing, with its own rigidity, which is greater than the rigidity of the micro-lens and of the membrane 124', planarity of the second surface 48" of the micro-lens 48. Moreover, the portion of membrane 124' that contacts the first surface 48' of the micro-lens 48 also functions as micro-lens and is optically coupled to the micro-lens 48, with which it forms a sort of total micro-lens, or set of micro-lenses, the optical behavior of which is, however, mainly determined by the curvature of the first surface 48' of the micro-lens 48, as well as by the refractive index of the latter.

The advantages that the present MEMS optical device affords emerge clearly from the foregoing description.

In particular, the present MEMS optical device can be manufactured in a relatively simple way since it does not require backend operations for providing the micro-lens and the supporting element. Moreover, the present manufacturing process makes it possible to render the geometry of the main cavity, which traverses the semiconductor, independent of the geometry of the supporting elements.

Figure 23:
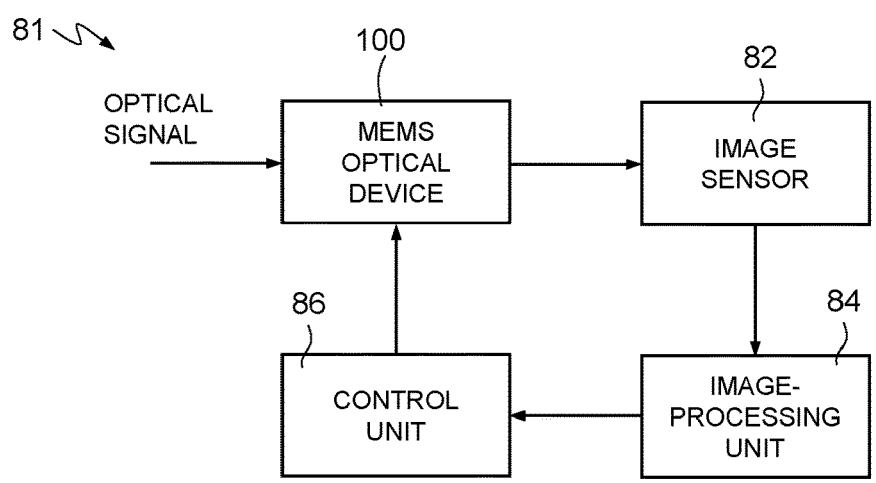
FIG. 23 shows a block diagram of an autofocus system including the present MEMS optical device.

The MEMS optical device 100 may find application, for example, in an autofocus system 81, illustrated in FIG. 23.

In detail, the autofocus system 81 comprises: the MEMS optical device 100; an image sensor 82, optically coupled to the MEMS optical device 100; an image-processing unit 84, electrically coupled to the image sensor 82; and a control unit 86, electrically coupled to the image-processing unit 84 and to the MEMS optical device 100.

The MEMS optical device 100 receives the optical signal, which passes through the micro-lens 48 to form an image that is detected by the image sensor 82. The image sensor 82 is, for example, a CMOS image sensor of a known type.

The image sensor 82 generates a first output signal as a function of the aforementioned image and sends it to the image-processing unit 84. The image-processing unit 84 analyses, via known techniques, the first output signal of the image sensor 82 and assigns to it a score as a function of the focusing quality of the image associated with the first output signal; the image-processing unit 84 moreover determines, via known autofocus algorithms, values of correction of the micro-lens 48 adapted to improve the focusing-quality score.

The image-processing unit 84 generates a second output signal, which contains the aforementioned information on the values of correction of the micro-lens 48 and is sent to the control unit 86. The control unit 86 comprises a circuit for driving the MEMS optical device 100, adapted to determine the voltage values best suited for driving the actuator 106 so as to obtain a deformation of the membrane 124' that will induce a deformation of the micro-lens 48 corresponding to the values of correction determined by the image-processing unit 84. In this way, the micro-lens 48 assumes the desired value of curvature. For instance, the control unit 86 may have access to a look-up table that stores a voltage value for each correction value that can be obtained from the micro-lens 48.

The autofocus system 81 hence implements a feedback method adapted to improve the quality of focusing of the image automatically.

Finally, it is clear that modifications and variations may be made with respect to what has been described and illustrated herein, without thereby departing from the scope of the present disclosure.

For instance, the material of the piezoelectric layer 28 may be other than PZT. Moreover, albeit not illustrated or described, the actuator 106 may include regions different from what has been described, such as passivation regions that encapsulate the actuator, albeit enabling biasing of the electrodes; moreover, regions of the actuator 106 may have shapes different from what has been described. For instance, the MEMS optical device may include conductive paths (not illustrated) connected to the top electrode and bottom electrode of the actuator 106.

The MEMS optical device may moreover include an antireflective structure of a known type, formed by one or more dielectric layers arranged in contact with the membrane 124', underneath the latter.

It is moreover possible for the micro-lens and the supporting element to be both made of vitreous material, in which case the thickness of the micro-lens is in any case smaller than the thickness of the supporting element, so that the micro-lens will in any case have a greater compliance than the supporting element.

As regards the manufacturing process, it may vary with respect to what has been described. For instance, with reference to what is illustrated in FIGS. 5-8, where formation is envisaged of the first and the second cured regions 34', 40', in which the second cavities 36 and the third cavities 45, respectively, are formed, it is possible for just one cured region to be formed; this single cured region is traversed by cavities obtained with a single photolithographic process, instead of by pairs of cavities overlaid on top of one another, obtained in two distinct photolithographic processes. However, the use of two distinct photolithographic processes enables, as explained previously, variation of the shape of the third cavities 45 with respect to the shape of the underlying second cavities 36.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A process, comprising:
    forming a main cavity in a semiconductor body;
    forming a membrane suspended over the main cavity;
    forming a piezoelectric actuator which is mechanically coupled to the membrane and electronically controllable to deform the membrane;
    forming a micro-lens mechanically coupled to the membrane and configured to undergo deformation in response to a deformation of the membrane; and
    forming a rigid optical element that contacts the micro-lens and is arranged so that the micro-lens is interposed between the rigid optical element and the membrane, and wherein the micro-lens and the main cavity are arranged on opposite sides of the membrane;
    forming a multilayer structure;
    selectively removing portions of the multilayer structure to form a number of first openings through the multilayer structure, each first opening facing a corresponding portion of the membrane;
    forming, on the multilayer structure and within the first openings, a first top region of polymeric material;
    selectively removing portions of the first top region to form second openings above the first openings, respectively, each second opening traversing the first top region and forming a first chamber with the respective underlying first opening; and
    curing the first top region;
    forming, on the first cured top region and within the first chambers, a second top region of polymeric material;
    selectively removing portions of the second top region so as to release the first chambers and forming, above each first chamber, a corresponding second chamber that traverses the second top region and communicates with the first chamber.

2. The process according to claim 1, further comprising:
    forming, on a semiconductor wafer, a dielectric layer;
    forming, on the dielectric layer, the multilayer structure including a piezoelectric layer; and
    forming, within the first chambers, corresponding micro-lenses, via deposition of a polymeric gel.

3. The process according to claim 2, further comprising:
    curing the second top region; wherein forming the micro-lenses within the first chambers includes forming the micro-lenses within the first chambers after curing the second top region; and arranging, in each second chamber, a corresponding rigid optical element in contact with the micro-lens formed in the second chamber,
wherein the curing the first top region is after forming the second openings and prior to forming the micro-lenses within the first chambers.

4. The process according to claim 3, wherein the second chambers have cross sections with a shape different from a shape of the underlying second openings.

5. The process according to claim 3, further comprising:
reducing a thickness of the semiconductor wafer, starting from a back side of the semiconductor wafer;
selectively removing portions of the wafer starting from the back side so as to form a plurality of main cavities, each of which extends as far as the dielectric layer; and
dicing the wafer.

6. The process according to claim 2, further comprising:
after forming the second openings, and prior to forming the micro-lenses within the first chambers, curing the first top region wherein forming the micro-lenses within the first chambers includes forming the micro-lenses within the first chambers after curing the first top region; and
arranging a plate of glass on the micro-lenses and the first cured top region.

7. The process according to claim 6, further comprising:
reducing a thickness of the semiconductor wafer, starting from a back side of the semiconductor wafer;
selectively removing portions of the wafer starting from the back side so as to form a plurality of main cavities, each of which extends as far as the dielectric layer; and
dicing the wafer and dividing the plate into a plurality of rigid optical elements.

8. A process, comprising:
forming a main cavity in a semiconductor body;
forming a membrane over the main cavity;
forming a piezoelectric actuator coupled to the membrane;
forming a micro-lens coupled to the membrane;
forming a rigid optical element on the micro-lens, the micro-lens is between the rigid optical element and the membrane, and the micro-lens and the main cavity are on opposite sides of the membrane;
forming, on a semiconductor wafer, a dielectric layer;
forming, on the dielectric layer, a multilayer structure including a piezoelectric layer;
forming a number of first openings through the multilayer structure, each first opening facing a corresponding portion of the membrane;
forming, on the multilayer structure and within the first openings, a first top region of polymeric material; and
forming second openings above the first openings, respectively, each second opening traversing the first top region and forming a first chamber with the respective underlying first opening.

9. The process according to claim 8, comprising:
forming, within the first chambers, corresponding micro-lenses, by forming a polymeric gel.

10. The process according to claim 9, comprising:
after forming the second openings and prior to forming the micro-lenses within the first chambers, curing the first top region;
forming, on the first cured top region and within the first chambers, a second top region of polymeric material;
releasing the first chambers and forming, above each first chamber, a corresponding second chamber that traverses the second top region and communicates with the first chamber;
curing the second top region;
arranging, in each second chamber, a corresponding rigid optical element in contact with the micro-lens in the second chamber.

11. The process according to claim 10 wherein the second chambers have cross sections with a shape different from a shape of the underlying second openings.

12. The process according to claim 10, comprising:
reducing a thickness of the semiconductor wafer, from a back side of the semiconductor wafer;
forming the main cavity that extends as far as the dielectric layer.

13. The process according to claim 9, comprising:
after forming the second openings, and prior to forming the micro-lenses within the first chambers, curing the first top region wherein forming the micro-lenses within the first chambers includes forming the micro-lenses within the first chambers after curing the first top region; and
arranging a plate of glass on the micro-lenses and the first cured top region.

14. A method, comprising:
forming a plurality of first cavities in a substrate;
forming a first dielectric layer on the substrate, the first dielectric layer extending across the plurality of cavities;
forming a first conductive layer on the first dielectric layer;
forming a second conductive layer on the first conductive layer;
forming a second dielectric layer on the second conductive layer;
forming a plurality of second cavities through the second dielectric layer, the second conductive layer, and the first conductive layer; and
forming a micro-lens in each of the plurality of second cavities.

15. The method of claim 14 wherein each second cavity is aligned with one of the plurality of first cavities.

16. The method of claim 15 wherein the first dielectric layer is between each second cavity and the respective first cavity.

17. The method of claim 16 wherein each micro-lens has a first dimension closer to the first dielectric layer and a second dimension that is further from the first dielectric layer, the second dimension being greater than the first dimension.

18. The method of claim 17, comprising forming a cured layer on the second dielectric layer and forming a plurality of openings in the cured layer that align with the micro-lenses.

19. The method of claim 18, comprising forming a support structure in each of the plurality of openings.

* * * * *